United States Patent [19]

Gupta et al.

[11] Patent Number: 4,992,134

[45] Date of Patent: Feb. 12, 1991

[54] DOPANT-INDEPENDENT POLYSILICON PLASMA ETCH

[75] Inventors: Subhash Gupta, San Jose; Kashmir Sahota, Union City, both of Calif.

[73] Assignee: Advanced Micro Devices, Inc., Sunnyvale, Calif.

[21] Appl. No.: 436,282

[22] Filed: Nov. 14, 1989

[51] Int. Cl.$^5$ ............................................. H01L 21/306
[52] U.S. Cl. ....................................... 156/628; 156/643; 156/653; 156/662; 437/937; 204/192.37
[58] Field of Search ............... 156/643, 653, 628, 662; 437/937; 204/192.32, 192.3

[56] References Cited

U.S. PATENT DOCUMENTS

| | | | |
|---|---|---|---|
| 4,255,230 | 3/1981 | Zajac | 156/662 |
| 4,361,461 | 11/1982 | Chang | 156/662 |
| 4,462,863 | 7/1984 | Nishimatsu et al. | 204/192.32 |
| 4,601,278 | 7/1986 | Robb | 156/662 |
| 4,610,731 | 9/1986 | Chevallier et al. | 437/957 |

FOREIGN PATENT DOCUMENTS

| | | |
|---|---|---|
| 57-58356 | 4/1982 | Japan ................................ 437/937 |
| 58-55568 | 4/1983 | Japan . |
| 59-144135 | 8/1984 | Japan . |

OTHER PUBLICATIONS

Wolf et al., Silicon Processing for the VLSI ERA, p. 520, vol. 1, Lattice Press.

*Primary Examiner*—David L. Lacey
*Assistant Examiner*—Todd J. Burns
*Attorney, Agent, or Firm*—David W. Collins

[57] ABSTRACT

A plasma etching process is provided which etches n-type, p-type, and intrinsic polysilicon on the same wafer at substantially the same rate. Native oxide is first removed by etching in a conventional oxide etchant, such as $SiCl_4/Cl_2$, $BCl_3/Cl_2$, $CCl_4$, other mixtures of fluorinated or chlorinated gases, and mixtures of Freon-based gases. The polysilicon is then etched in an etchant comprising at least about 75% hydrogen and the balance a halogen-containing fluid, such as chloride. The silicon etchant etches at a rate of about 300 to 500 Å for a batch of 10 wafers, depending on hydrogen concentration, power, flow rate of gas mixture, and gas pressure.

12 Claims, No Drawings

DOPANT-INDEPENDENT POLYSILICON PLASMA ETCH

BACKGROUND OF THE INVENTION

1. Field of the Invention

The present invention is related to processing of silicon-based integrated circuits, and, more particularly, to etching of polysilicon used in devices in such circuits.

2. Description of the Related Art

In many silicon-based devices, particularly CMOS (complementary metal oxide semiconductor), both n-type and p-type polysilicon are used. For example, n-type polysilicon is used as the gate electrode and/or electrode making a "buried contact" for n-channel devices; p-type polysilicon is used as the gate electrode and/or "buried contact" for p-channel devices. Often, the polysilicon is formed as layers on the same level, and it is desired to etch both n-type and p-type layers, simultaneously.

Usually, n-type polysilicon etches at a much faster rate than p-type polysilicon in conventional plasma etching apparatus, employing fluorinated or chlorinated plasma, generated from gases such as $SF_6$, $Cl_2$, $CCl_4$, Freons, etc. A process has been developed for use with separate wafers, each wafer having solely one or the other material may be etched at about the same rate. In this process, a mixture of $Cl_2$ and $BCl_3$ is employed to anisotropically etch polycide (n+ or p+ polysilicon with $MoSi_2$ cap). The process is described by T. C. Mele et al, "Anisotropic Reactive Ion Etching of $MoSi_2$ and In-Situ Doped N+ and P+ Polysilicon Using $Cl_2$ and $BCl_3$", Semiconductor Research Corporation, Sept. 22, 1987.

At the present time, it is not possible to etch both n- and p-type polysilicon layers simultaneously on the same wafer. The ability to do so would improve the processing efficiency of silicon devices and provide a flexibility in developing architecture, particularly CMOS devices.

SUMMARY OF THE INVENTION

Accordingly, it is an object of the present invention to provide a process for simultaneously etching n-type, p-type, and intrinsic polysilicon on the same wafer.

It is also an object of the present invention to provide such a process that may be extended for use with n-doped, p-doped, or undoped silicon, whether any one of these forms, any two of these forms, or all three of these forms.

It is yet another object of the invention to provide an etchant composition that may be used to plasma-etch n-type, p-type, and intrinsic polysilicon simultaneously on the same wafer.

In accordance with the invention, a novel etching composition comprising at least about 75% hydrogen and the balance a halogen-containing fluid etches n-type, p-type and intrinsic at substantially the same rate (in the range of about 300 to 500 Å per minute for a 10-wafer batch). The etchant mixture is used in conventional plasma etchers, with good vacuum integrity. An initial native oxide breakthrough process, such as a mixture of $SiCl_4$ and $Cl_2$, is used for about 5 to 20 seconds prior to the polysilicon etch.

The ability to etch n-type, p-type, and intrinsic polysilicon at the same time on the same wafer can enhance the production efficiency of CMOS circuits. Further, the etchant composition of the invention is also useful for simultaneously etching n-doped, p-doped, and undoped single crystal silicon with different levels of impurities on the same wafer.

Other objects, features and advantages of the present invention will become apparent upon consideration of the following detailed description.

DETAILED DESCRIPTION OF THE INVENTION

Reference is now made in detail to a specific embodiment of the present invention, which illustrates the best mode presently contemplated by the inventors for practicing the invention. Alternative embodiments are also briefly described as applicable.

A process has been designed and developed to etch (anisotropic/isotropic) n-type, p-type and intrinsic polysilicon simultaneously with similar etch rates. The basic concept behind this invention is that an additional gas is introduced along with etchant gas(es) which preferentially binds (by Van der Walls forces) with the dopants in the polysilicon lattice, thus shielding the inductive effects of the dopants on the neighboring silicon atoms, and consequently making their behavior analogous to ones in intrinsic polysilicon during the pattern delineation by the etchant species. This process is very useful especially for CMOS technologies where n- and p-channels can be defined by a single mask/etch step in polysilicon.

In the process of the invention, a novel etchant is used to plasma-etch n-type, p-type, and intrinsic polysilicon. The etchant comprises at least about 75% hydrogen and the balance a halogen-containing fluid. The halogen-containing fluid is one which may be a liquid or a gas under ambient conditions, but in the process of the invention, is a gas.

At least 75% hydrogen is required in order to avoid using a possibly explosive mixture. More than about 95% hydrogen results in insufficient halogen-containing fluid to etch at an acceptable rate. Preferably, the amount of hydrogen ranges from about 85 to 95%.

The halogen-containing fluid may comprise any of the well-known chlorine- and fluorine-containing fluids, such as $Cl_2$, $SiCl_4$, $CCl_4$, $SF_6$, and halogenated hydrocarbons containing one or more fluorine atoms sold under the trademark Freon. For ease of use, $Cl_2$ is especially preferred.

An initial native oxide break-through step for about 5 to 10 seconds is required before the etching of the polysilicon layer. Any conventional polysilicon or oxide etch process can expedite the step. Typically, chlorine- or fluorine-containing fluids, such as $CCl_4$ or $CF_4 + O_2$, or mixtures of fluorinated or chlorinated gases, such as $SiCl_4/Cl_2$ or $BCl_3/Cl_2$ or Freons, may be employed.

The etching process of the invention is advantageously employed in etching wafers in a batch reactor. The etchant etches n-type, p-type, and intrinsic polysilicon at substantially the same rate, ranging from about 300 to 500 Å per minute for a batch of ten wafers, depending on the hydrogen/halogen ratio, the reactor power, flow rate of the gaseous mixture, and gas pressure.

The reactor power depends on the type of reactor employed. For a single wafer reactor, the power density may range from about 1 to 2 watt/$cm^2$, and preferably is about 1 watt/$cm^2$. For a batch reactor, the power density may range from about 0.5 to 1 watt/cm$^2$, and preferably is about 0.75 watt/cm$^2$.

The flow rate of the gaseous mixture depends on the gas pressure employed. The gas pressure ranges from about 50 mTorr to about 130 mTorr, and is preferably at least about 70 mTorr and less than 130 mTorr. Most preferably, the gas pressure ranges from about 90 to 100 mTorr. At the lower range, the etch rate is too slow, while above about 130 mTorr, local loading effects play an increasing role in the etch rate. Such local loading effects are due to the relative densities of polysilicon patterns. On any given wafer, there will be regions of relatively low polysilicon density and other regions where polysilicon lines are closely crowded together. At high gas pressures, such a variation in polysilicon density can result in an unacceptable variation in the etch rate.

A total flow rate of about 200 sccm for both hydrogen and the halogen-containing fluid is employed at a pressure of about 100 mTorr in a batch reactor to minimize local loading effects. In a single wafer reactor, the total flow rate is about 40 to 50 sccm under the same pressure conditions. It is observed that at low flow rates, the etch rate drops, and the local loading effect dominates. Relatively simple experimentation will determine the optimum process conditions for a given reactor.

Without subscribing to any particular theory, it appears that the reason n+, p$^{30}$ and undoped polysilicon in close proximity etches at different rates on the same wafer is due to the difference in polarizability between the orbital electron cloud of a silicon atom having a phosphorus atom (electron-deficient) being physically close thereto and the orbital electron cloud of a silicon atom having a boron atom (electron-rich) physically close thereto. However, by adding hydrogen to the etchant mixture, it appears that the hydrogen, whether in the form of molecular or atomic hydrogen, binds the impurity species (phosphorus or boron), whereby the Si atoms are relatively unperturbed by the presence of B or P.

Even heavily doped (phosphorus or boron) polysilicon or n-type and p-type polysilicon can be etched at substantially the same rate as intrinsic polysilicon, due to the presence of hydrogen, which subdues the electrostatic dipole-dipole attraction, or polarizability, of the Si electronic cloud, due to the perturbations caused by impurities (e.g., P or B). For example, H/H+ species can be attracted by P or B atoms while they are present in the silicon surface, thereby nullifying the inductive effects to a great extent. Consequently, the doped Si surface will behave almost like an intrinsic silicon surface.

EXAMPLES

EXAMPLE 1

Based on the above principle, a batch of ten wafers was etched in a batch reactor at the same time, employing the following process conditions:

(1) The native oxide was removed by etching with SiCl$_4$ (40 sccm) and Cl$_2$ (40 sccm) (total flow=80 sccm), employing a power of 600 watts and a pressure of 100 mTorr. The etch time was 15 seconds, at an oxide etch rate of about 70 Å/min.

(2) Polysilicon was removed by etching with a gaseous mixture of 89% H$_2$ and 11% Cl$_2$ (total flow=180 sccm), employing a power of 550 watts (0.7 watt/cm$^2$) and a pressure of 100 mTorr. The etch rate for polysilicon (n p, or intrinsic) was 350±20 Å/min; the etch rate for silicon oxide was 15 to 17 Å/min.

EXAMPLE 2

In a batch reactor, the native oxide was first removed, then a batch of wafers was exposed to a mixture of 93% H$_2$ and 7% Cl$_2$. The power was 500 watts and the pressure was 130 mTorr. The etch rate was found to be about 350 Å/min. However, local loading effects were observed, with areas having a relatively high density of polysilicon etching somewhat more slowly than those areas of lower density. A local variation (approximately 10%) in etch rate was observed.

EXAMPLE 3

In a batch reactor, the native oxide was first removed, then a batch of wafers was exposed to a mixture of 78% H$_2$ and 22% Cl$_2$. The power was 550 watts and the pressure was 100 mTorr. The etch rate was found to be about 450±50 Å/min. P-type polysilicon was observed to etch somewhat more slowly than n-type, with n-type etching at a rate of about 480 Å/min and p-type etching at a rate of about 400 Å/min.

EXAMPLE 4

In a batch reactor, the native oxide was first removed, then a batch of wafers was exposed to a mixture of 95% H$_2$ and 5% Cl$_2$. The power was 550 watts and the pressure was 130 mTorr. The etch rate was found to be about 150±15 Å/min. N-type polysilicon was observed to etch somewhat more slowly than p-type, with p-type etching at a rate of about 140 Å/min and n-type etching at a rate of about 155 Å/min.

The foregoing description of the preferred embodiment of the present invention has been presented for purposes of illustration and description. It is not intended to be exhaustive or to limit the invention to the precise form disclosed. Obviously, many modifications and variations will be apparent to the practitioners skilled in this art. It is possible that the invention may be practiced in other fabrication technologies in MOS or bipolar processes. Similarly, any process steps described might be interchangeable with other steps in order to achieve the same result. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

What is claimed is:

1. A process for etching n-type, p-type, and intrinsic silicon on the same wafer at substantially the same rate, comprising:
   (a) removing any native oxide on exposed surfaces of said silicon by exposure to a first plasma etchant capable of etching native oxide; and
   (b) exposing said silicon to plasma etching, using a second etchant comprising at least 75% and less than about 95% hydrogen and the balance a halogen-containing fluid so as to etch said n-type, p-type, and intrinsic silicon at substantially the same rate.

2. The process of claim 1 wherein said native oxide etchant is selected from the group consisting of mixtures of fluorinated gases, mixtures of chlorinated gases, and mixtures of halogenated hydrocarbon gases containing one or more fluorine atoms sold under the trademark Freon.

3. The process of claim 2 wherein said first etchant is selected from the group consisting of $SiCl_4/Cl_2$, $BCl_3/Cl_2$, $CCl_4$, $SF_6$, and $CF_4+O_2$.

4. The process of claim 2 wherein said oxide is exposed to said first etchant for about 5 to 20 seconds.

5. The process of claim 1 wherein said halogen-containing fluid consists essentially of chlorine- and fluorine-containing fluids.

6. The process of claim 5 wherein said halogen-containing fluid consists essentially of a fluid selected from the group consisting of $Cl_2$, $SiCl_4$, $CCl_4$, $SF_6$, and halogenated hydrocarbons containing one or more fluorine atoms sold under the trademark Freon.

7. The process of claim 6 wherein said halogen-containing fluid consists essentially of $Cl_2$.

8. The process of claim 1 wherein said second etchant consists essentially of about 85 to about 95% hydrogen and the balance said halogen-containing fluid.

9. The process of claim 8 wherein said second etchant consists essentially of about 89% hydrogen and 11% chlorine.

10. The process of claim 1 wherein said silicon is exposed to said second etchant at a pressure of about 50 to 130 mTorr of said second etchant.

11. The process of claim 10 wherein said pressure ranges from about 70 to less than 130 mTorr.

12. The process of claim 11 wherein said pressure ranges from about 90 to 100 mTorr.

* * * * *